US010808317B2

(12) United States Patent
Chandrasekharan et al.

(10) Patent No.: US 10,808,317 B2
(45) Date of Patent: Oct. 20, 2020

(54) DEPOSITION APPARATUS INCLUDING AN ISOTHERMAL PROCESSING ZONE

(71) Applicant: Lam Research Corporation, Fremont, CA (US)

(72) Inventors: Ramesh Chandrasekharan, Portland, OR (US); Jeremy Tucker, Portland, OR (US); Karl Leeser, West Linn, OR (US); Alan Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 960 days.

(21) Appl. No.: 13/934,624

(22) Filed: Jul. 3, 2013

(65) Prior Publication Data

US 2015/0011096 A1 Jan. 8, 2015

(51) Int. Cl.
*C23C 16/00* (2006.01)
*C23C 16/455* (2006.01)
*C23C 16/509* (2006.01)

(52) U.S. Cl.
CPC ...... *C23C 16/45565* (2013.01); *C23C 16/509* (2013.01)

(58) Field of Classification Search
CPC ................................................ C23C 16/45565
(Continued)

(56) References Cited

U.S. PATENT DOCUMENTS 5,102,523 A 4/1992 Beisswenger et al.
5,433,787 A 7/1995 Suzuki et al.
(Continued)

FOREIGN PATENT DOCUMENTS

CN 101663417 A 3/2010
CN 102212798 A 10/2011
(Continued)

OTHER PUBLICATIONS

Office Action dated Jan. 30, 2018 in corresponding Japanese Patent Application No. 2014-136382, 11 pages.
(Continued)

*Primary Examiner* — Sylvia MacArthur
*Assistant Examiner* — Michelle Crowell
(74) *Attorney, Agent, or Firm* — Schwegman Lundberg & Woessner, P.A.

(57) ABSTRACT

A deposition apparatus for processing semiconductor substrates having an isothermal processing zone comprises a chemical isolation chamber in which semiconductor substrates are processed. A process gas source is in fluid communication with a showerhead module which delivers process gases from the process gas source to the isothermal processing zone wherein the showerhead module includes a faceplate wherein a lower surface of the faceplate forms an upper wall of a cavity defining the isothermal processing zone, a backing plate, and an isolation ring which surrounds the faceplate and the backing plate. At least one compression seal is compressed between the faceplate and the backing plate which forms a central gas plenum between the faceplate and the backing plate. A substrate pedestal module is configured to heat and support a semiconductor substrate wherein an upper surface of the pedestal module forms a lower wall of the cavity defining the isothermal processing zone within the chemical isolation chamber. A vacuum source is in fluid communication with the isothermal processing zone for evacuating process gas from the processing zone.

16 Claims, 9 Drawing Sheets

(58) Field of Classification Search
USPC .......................................................... 118/715
See application file for complete search history.

(56) References Cited

U.S. PATENT DOCUMENTS

| | | | |
|---|---|---|---|
| 5,449,410 A | 9/1995 | Chang et al. | |
| 5,595,606 A | 1/1997 | Fujikawa et al. | |
| 5,614,026 A | 3/1997 | Williams | |
| 5,624,498 A | 4/1997 | Lee et al. | |
| 5,781,693 A | 7/1998 | Balance et al. | |
| 5,810,048 A | 9/1998 | Zeiner-Gundersen | |
| 5,871,586 A | 2/1999 | Crawley et al. | |
| 5,900,103 A * | 5/1999 | Tomoyasu | C23C 16/4405 118/723 E |
| 6,036,782 A | 3/2000 | Tanaka et al. | |
| 6,086,677 A | 7/2000 | Umotoy et al. | |
| 6,245,396 B1 | 6/2001 | Nogami | |
| 6,302,964 B1 | 10/2001 | Umotoy et al. | |
| 6,435,428 B2 | 8/2002 | Kim et al. | |
| 6,461,435 B1 | 10/2002 | Littau et al. | |
| 6,553,932 B2 | 4/2003 | Liu et al. | |
| 6,692,575 B1 | 2/2004 | Omstead et al. | |
| 6,827,815 B2 | 12/2004 | Hytros et al. | |
| 6,878,402 B2 | 4/2005 | Chiang et al. | |
| 6,886,491 B2 | 5/2005 | Kim et al. | |
| 6,983,892 B2 | 1/2006 | Noorbakhsh et al. | |
| 7,375,946 B2 | 5/2008 | White et al. | |
| 7,410,676 B2 | 8/2008 | Kim et al. | |
| 7,520,957 B2 | 4/2009 | Kao et al. | |
| 7,737,035 B1 | 6/2010 | Lind et al. | |
| 7,745,346 B2 | 6/2010 | Hausmann et al. | |
| 7,993,457 B1 | 8/2011 | Krotov et al. | |
| 8,006,982 B2 | 8/2011 | Whitlow et al. | |
| 8,137,467 B2 | 3/2012 | Meinhold et al. | |
| 8,187,951 B1 | 5/2012 | Wang et al. | |
| 8,192,806 B1 | 6/2012 | Varadarajan et al. | |
| 8,272,346 B2 | 9/2012 | Bettencourt et al. | |
| 8,282,983 B1 | 10/2012 | Kapoor et al. | |
| 8,287,647 B2 | 10/2012 | Yoon et al. | |
| 8,313,610 B2 | 11/2012 | Dhindsa | |
| 8,317,968 B2 | 11/2012 | Dhindsa et al. | |
| 8,343,307 B2 | 1/2013 | Huston | |
| 8,357,435 B2 | 1/2013 | Lubomirsky et al. | |
| 8,362,571 B1 | 1/2013 | Wu et al. | |
| 2002/0093148 A1 | 7/2002 | Golovato et al. | |
| 2005/0183827 A1* | 8/2005 | White | C23C 16/45565 156/345.34 |
| 2006/0288934 A1* | 12/2006 | Takahashi | C23F 4/00 118/715 |
| 2007/0044714 A1* | 3/2007 | White | C23C 16/45565 118/715 |
| 2007/0102888 A1 | 5/2007 | Takahiro et al. | |
| 2008/0099146 A1* | 5/2008 | Keller | H01J 37/3244 156/345.34 |
| 2008/0242085 A1* | 10/2008 | Fischer | C23C 16/45565 438/680 |
| 2009/0007846 A1* | 1/2009 | Keller | H01J 37/3244 118/715 |
| 2009/0014323 A1 | 1/2009 | Yendler et al. | |
| 2011/0146571 A1 | 6/2011 | Bartlett et al. | |
| 2011/0197814 A1* | 8/2011 | Baek | C23C 16/45565 118/723 E |
| 2011/0256724 A1 | 10/2011 | Chandrasekharan et al. | |
| 2011/0256726 A1 | 10/2011 | LaVoie et al. | |
| 2011/0284100 A1* | 11/2011 | Kudela | C23C 16/45565 137/343 |
| 2012/0171871 A1* | 7/2012 | Dhindsa | H01J 37/3244 438/710 |
| 2012/0222815 A1* | 9/2012 | Sabri | C23C 16/45565 156/345.34 |
| 2012/0231628 A1 | 9/2012 | Lee | |
| 2013/0001899 A1 | 1/2013 | Hwang et al. | |
| 2013/0092086 A1 | 4/2013 | Keil et al. | |
| 2013/0299605 A1* | 11/2013 | Ehrlich | H01J 37/3244 239/128 |
| 2013/0330929 A1* | 12/2013 | Eto | H01L 21/67069 438/710 |

FOREIGN PATENT DOCUMENTS

| | | |
|---|---|---|
| CN | 104282530 A | 1/2015 |
| CN | 104282530 B | 11/2018 |
| JP | H11111626 A | 4/1999 |
| JP | 2005256172 A | 9/2005 |
| JP | 2010524205 A | 7/2010 |
| JP | 2015028212 A | 2/2015 |
| JP | 2015029132 A | 2/2015 |
| JP | 6573754 B2 | 8/2019 |
| KR | 20060042164 A | 5/2006 |
| KR | 20140146212 A | 12/2014 |
| KR | 20150004768 A | 1/2015 |
| SG | 10201403694 | 2/2015 |
| SG | 10201710505 | 1/2018 |
| TW | 200533776 A | 10/2005 |
| TW | 201414870 A | 4/2014 |
| TW | 201516177 A | 5/2015 |
| WO | 2008121288 A1 | 10/2008 |

OTHER PUBLICATIONS

Chinese Application Serial No. 201410317527.7, Office Action dated Dec. 4, 2017, W/O English Translation, 7 pgs.
Japanese Application Serial No. 2014-136382, Notification of Reasons for Refusal dated Sep. 11, 2018, 9 pgs.
Taiwanese Application Serial No. 103122898, Office Action dated Nov. 22, 2017, W/English Translation, 10 pgs.
Official Communication (Notice of Reason for Refusal) dated Apr. 2, 2019 in corresponding Japanese Patent Application No. 2014-136382 with Machine Translation (4 pages).

* cited by examiner

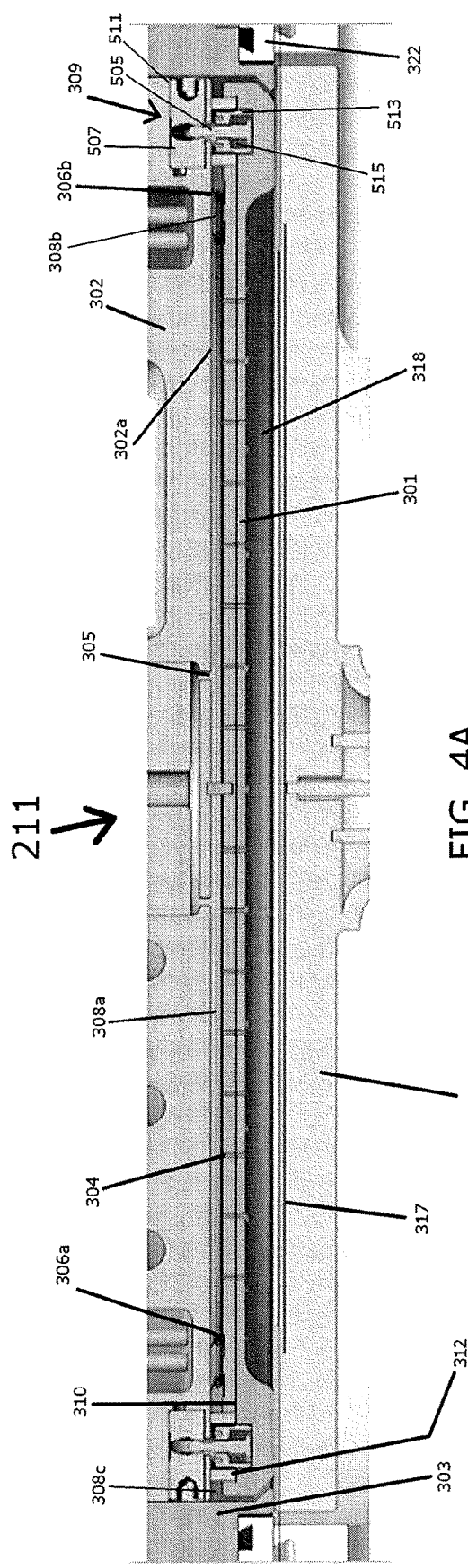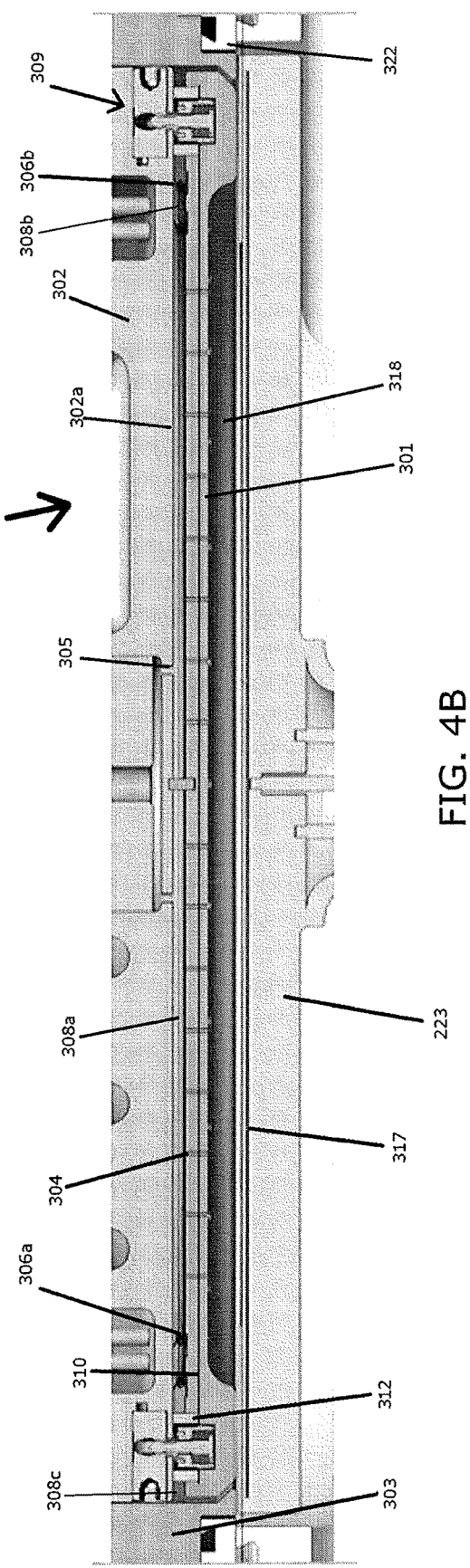

US 10,808,317 B2

DEPOSITION APPARATUS INCLUDING AN ISOTHERMAL PROCESSING ZONE

FIELD OF THE INVENTION

This invention pertains to apparatuses for conducting chemical depositions, and may find particular use in conducting plasma enhanced chemical depositions of thin films.

BACKGROUND

Plasma processing apparatuses are used to process semiconductor substrates by techniques including etching, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), plasma enhanced pulsed deposition layer (PEPDL) processing, and resist removal. One type of plasma processing apparatus used in plasma processing includes a reaction chamber containing top and bottom electrodes. A radio frequency (RF) power is applied between the electrodes to excite a process gas into a plasma for processing semiconductor substrates in the reaction chamber. In such chambers nonuniform heating across a semiconductor substrate can lead to nonuniform substrate processing.

SUMMARY

Disclosed herein is a deposition apparatus for processing semiconductor substrates wherein the deposition apparatus has an isothermal processing zone. The deposition apparatus comprises a chemical isolation chamber in which semiconductor substrates are processed. A process gas source is in fluid communication with the chemical isolation chamber for supplying a process gas into the chemical isolation chamber wherein a showerhead module delivers process gases from the process gas source to the isothermal processing zone. The showerhead module includes a faceplate wherein a lower surface of the faceplate forms an upper wall of a cavity defining the isothermal processing zone, a backing plate, an isolation ring which surrounds the faceplate and the backing plate wherein the isolation ring supports the backing plate, a support element which attaches the faceplate to the backing plate, and at least one compression seal which forms an outer perimeter of a central gas plenum between the faceplate and the backing plate. A contact area between the support element and the faceplate is less than 1% of the total surface area of the faceplate. A substrate pedestal module is configured to heat and support a semiconductor substrate wherein an upper surface of the pedestal module forms a lower wall of the cavity defining the isothermal processing zone within the chemical isolation chamber, and an evacuation apparatus is in fluid communication with the isothermal processing zone for evacuating process gas from the processing zone.

Also disclosed herein is a showerhead module of a plasma processing apparatus. The showerhead module delivers process gases from a process gas source to an isothermal processing zone. The showerhead module includes a faceplate wherein a lower surface of the faceplate forms an upper wall of a cavity defining the isothermal processing zone, a backing plate, an isolation ring which surrounds the faceplate and the backing plate wherein the isolation ring supports the backing plate, a support element which attaches the faceplate to the backing plate, and at least one compression seal which forms an outer perimeter of a central gas plenum between the faceplate and the backing plate. A contact area between the support element and the faceplate is less than 1% of the total surface area of the faceplate.

BRIEF DESCRIPTION OF THE DRAWING FIGURES

FIGS. 4A-4E each illustrate a cross section of a showerhead module arranged in accordance with embodiments disclosed herein.

Figure 5A:
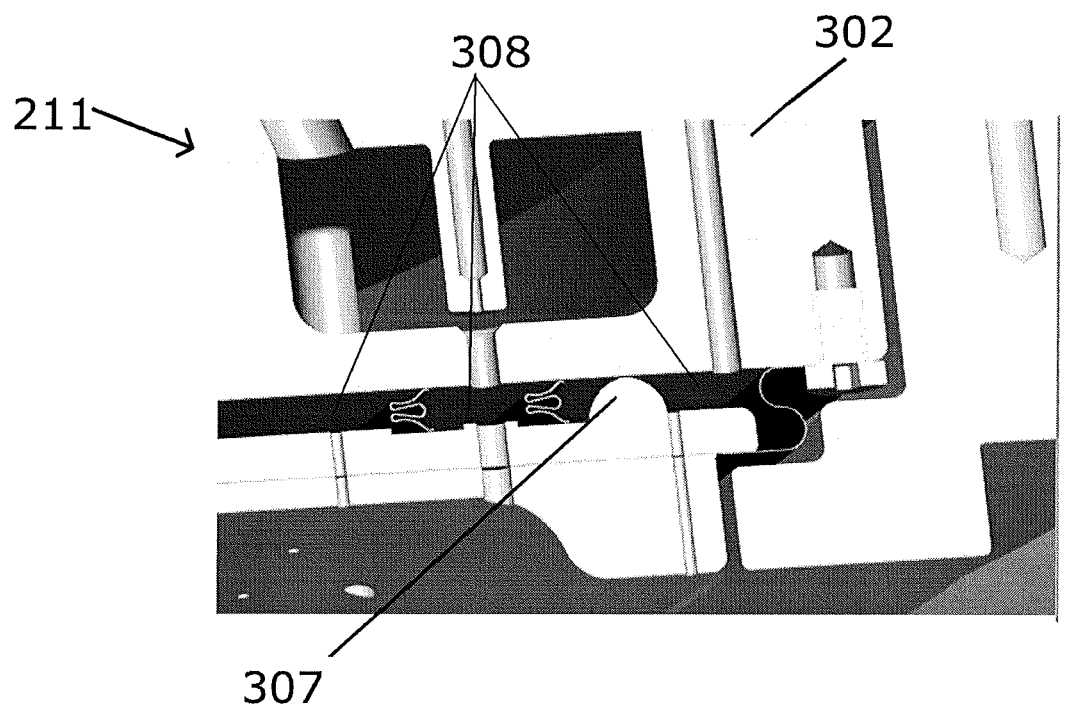
Figure 5B:
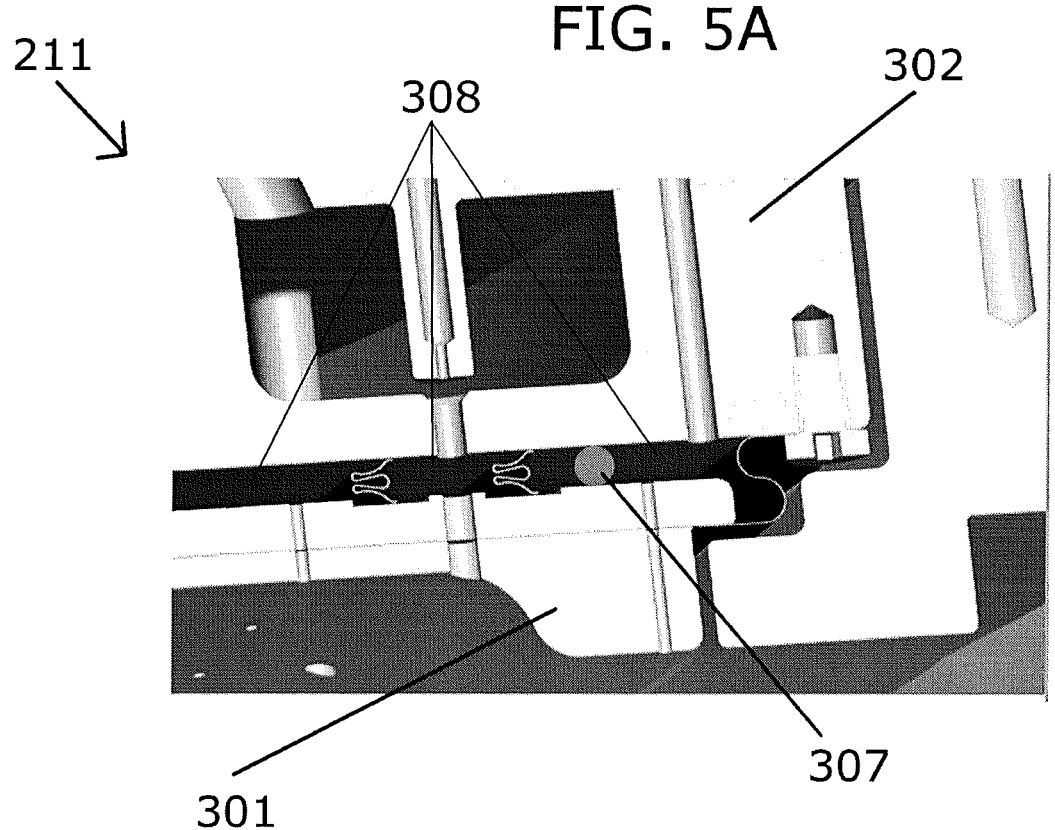

FIGS. 5A, 5B each illustrate a cross section of a showerhead module arranged in accordance with embodiments disclosed herein.

Figure 6:
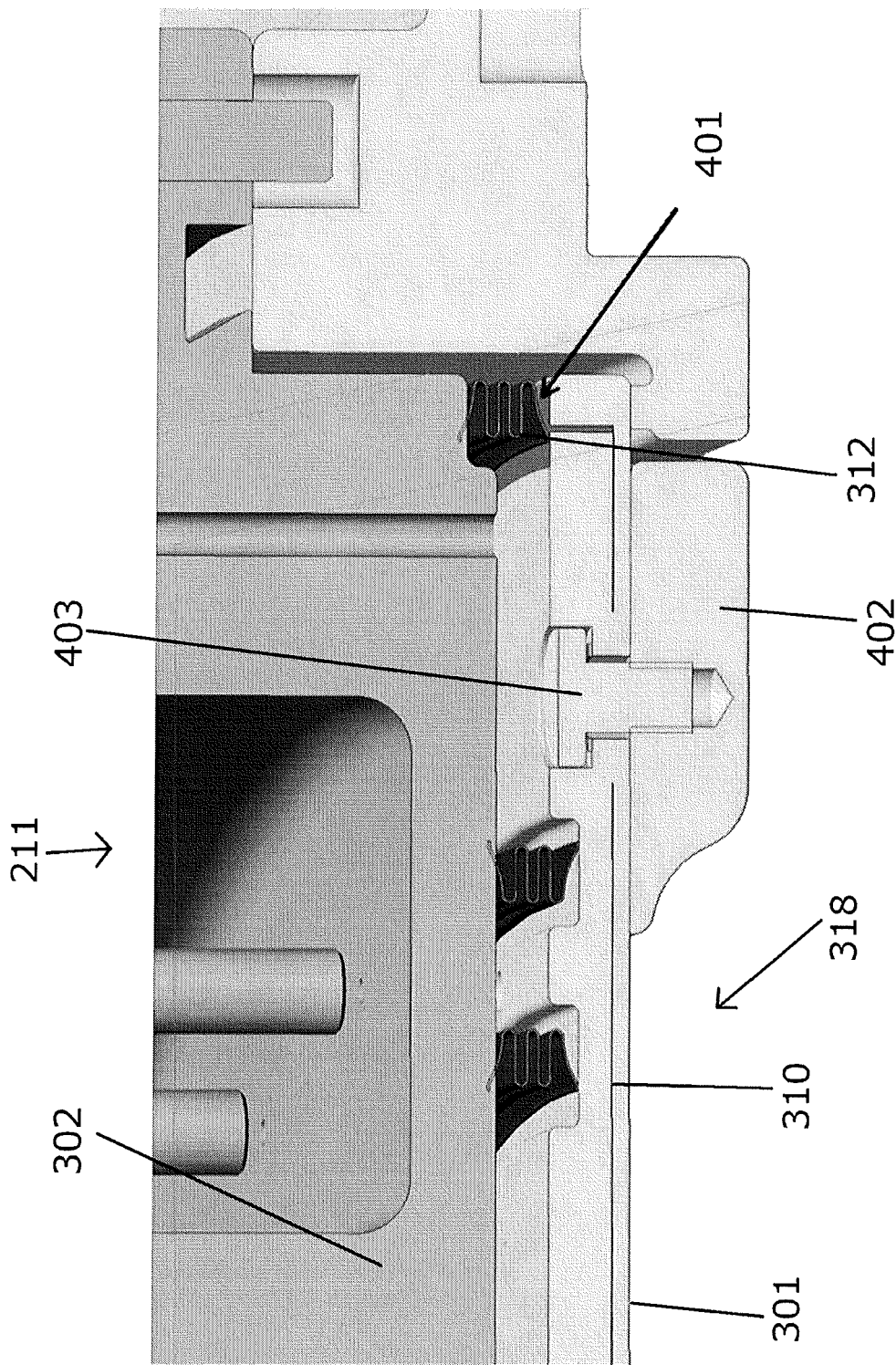

FIG. 6 illustrates a cross section of a showerhead module arranged in accordance with embodiments disclosed herein.

DETAILED DESCRIPTION

In the following detailed description, numerous specific embodiments are set forth in order to provide a thorough understanding of the apparatus and methods disclosed herein. However, as will be apparent to those skilled in the art, that the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

As indicated, present embodiments provide apparatus and associated methods for conducting a chemical deposition such as a plasma enhanced chemical vapor deposition. The apparatus and methods are particularly applicable for use in conjunction with semiconductor fabrication based dielectric deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), or plasma enhanced pulsed deposition layer (PEPDL) processing), however they are not so limited.

The aforementioned processes can suffer from some drawbacks associated with nonuniform temperatures across a wafer or substrate receiving deposited material. For example, nonuniform temperatures may develop across a substrate when a passively heated showerhead, which is in thermal contact with surrounding chamber components, loses heat to the surrounding components. Therefore, the showerhead which forms an upper wall of a processing zone is preferably thermally isolated from the surrounding components such that an isothermal processing zone may be formed, thereby forming uniform temperatures across the substrate and uniform temperatures across the showerhead face (i.e. upper wall of the processing zone). The uniform temperatures across the substrate aid in the uniform processing of semiconductor substrates wherein the substrate temperature provides activation energy for the deposition process and is therefore a control means for driving the deposition reaction. The uniform temperatures across the showerhead also aid in uniform gas phase reactions above a semiconductor substrate. The uniform temperatures also aid in choice of materials with lower thermal conductivity but higher corrosion resistance.

Further, there are generally two main types of deposition showerheads: the chandelier type and the flush mount. The chandelier showerheads have a stem attached to the top of the chamber on one end and the faceplate on the other end, resembling a chandelier. A part of the stem may protrude the chamber top to enable connection of gas lines and RF power. Thus, larger chamber volumes which must be evacuated during processing, such as those required by the chandelier design, can become throughput prohibitive. The flush mount showerheads, however, are integrated into the top of a chamber and do not have a stem, and therefore, the chamber volume which must be evacuated can be reduced. Present embodiments disclosed herein pertain to a flush mount type showerhead wherein the flush mount showerhead reduces chamber volume which must be evacuated by a vacuum source during processing. The flush mount showerheads can lose heat from the showerhead face and body to the rest of the chamber through conduction. This not only lowers the temperature of the faceplate of the showerhead, but also introduces radial temperature non-uniformities in the showerhead face exposed to the processing zone. Embodiments disclosed herein reduce heat loss from the showerhead to the chamber through conduction, and increase radial temperature uniformity of the face of the showerhead exposed to the processing zone, thereby forming an isothermal processing zone.

Figure 1:
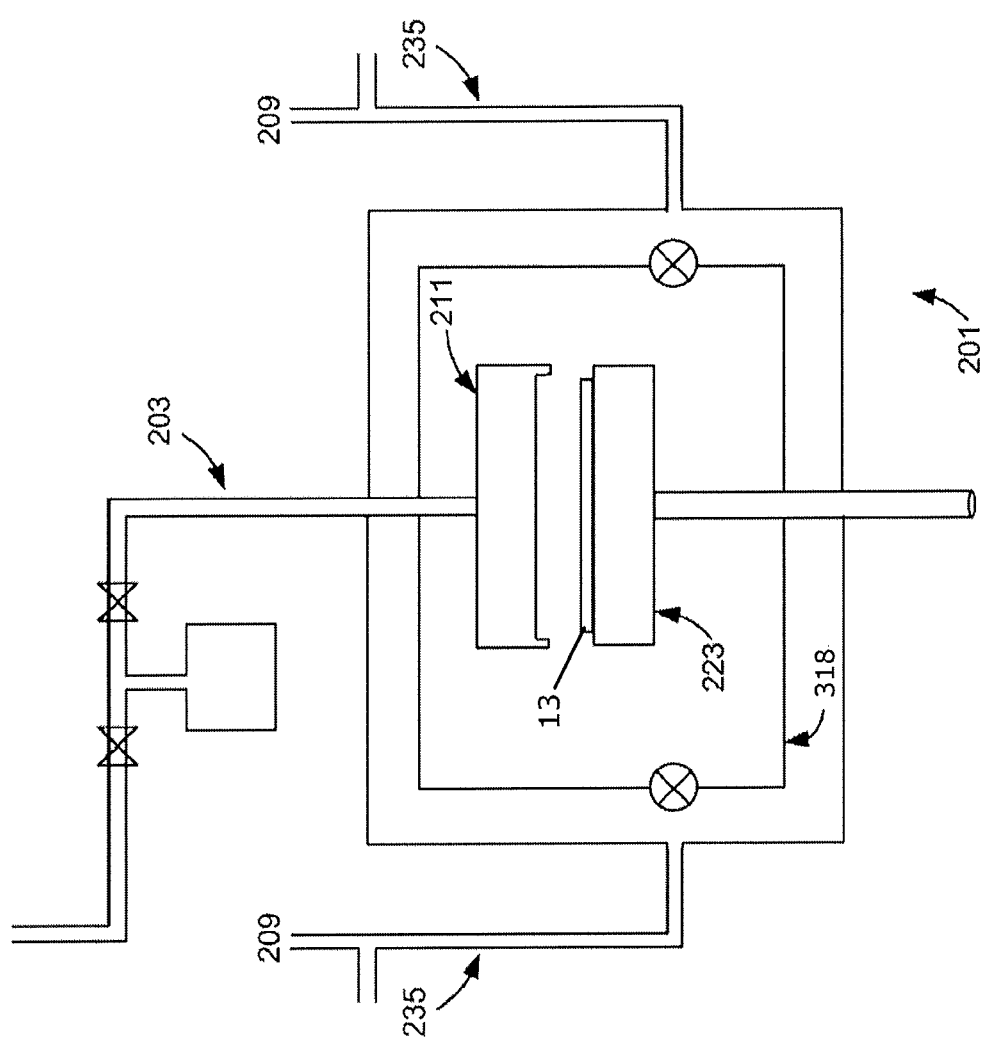
FIG. 1 illustrates a schematic diagram showing an overview of a chemical deposition apparatus in accordance with embodiments disclosed herein.

FIG. 1 is a schematic diagram showing an overview of a chemical deposition apparatus 201 in accordance with embodiments disclosed herein. A substrate 13 sits on top of a movable pedestal module 223 that can be raised or lowered relative to a showerhead module 211, which may also be moved vertically. Reactant material gases are introduced into a processing zone 318 of the chamber via gas line 203. Note that the apparatus may be modified to have one or more gas lines, depending on the number of reactant gases used. The chamber is evacuated through vacuum lines 235 that are connected to a vacuum source 209. The vacuum source may be a vacuum pump.

Figure 2:
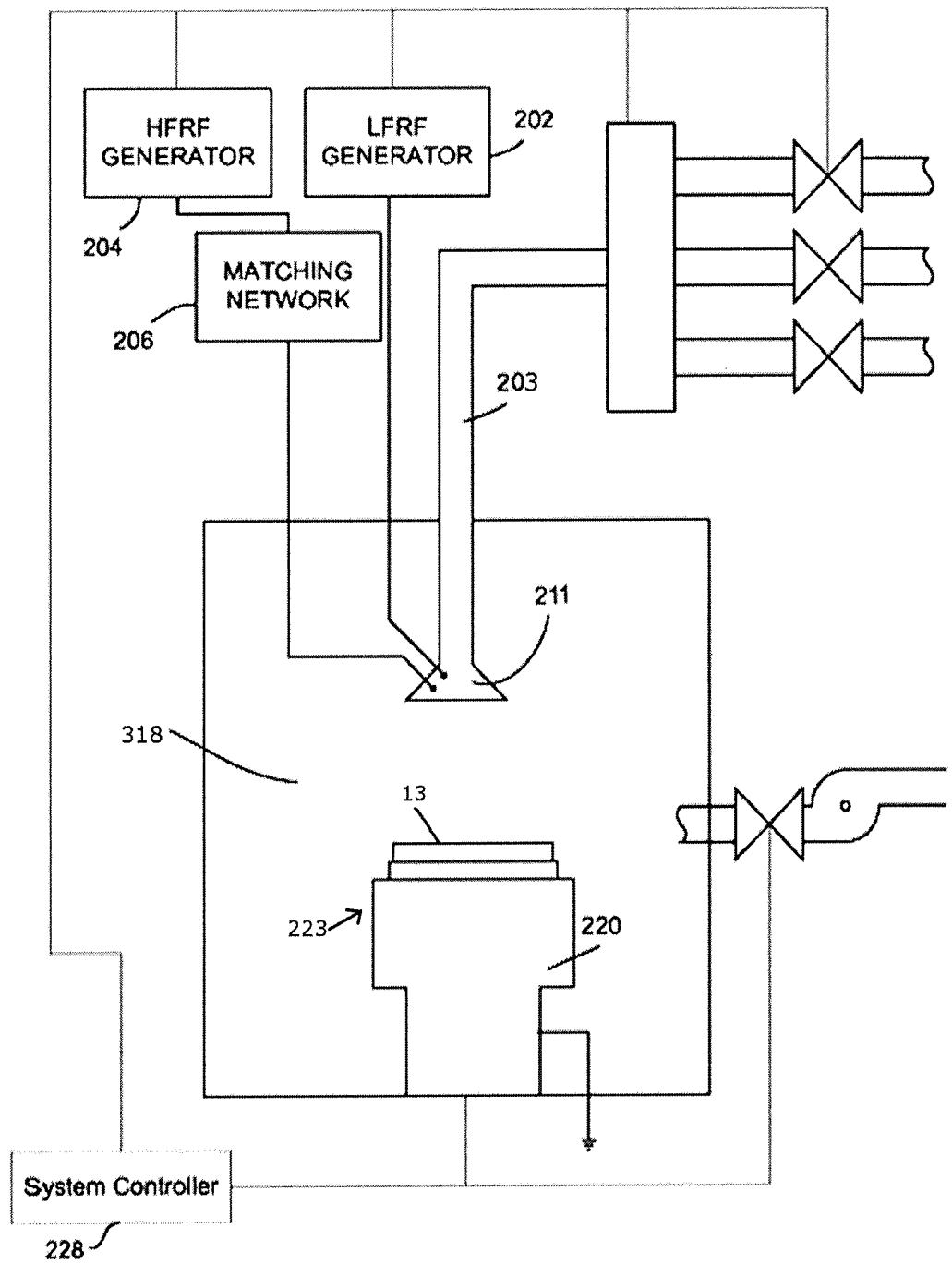
FIG. 2 illustrates a block diagram depicting various apparatus components arranged for implementing embodiments disclosed herein wherein plasma can be utilized to enhance deposition and/or surface reactions between reacting species during the generation of thin films.

Embodiments disclosed herein are preferably implemented in a plasma enhanced chemical deposition apparatus (i.e. PECVD apparatus, PEALD apparatus, or PEPDL apparatus). FIG. 2 provides a simple block diagram depicting various apparatus components arranged for implementing embodiments disclosed herein wherein plasma is utilized to enhance deposition. As shown, a processing zone 318 serves to contain the plasma generated by a capacitively coupled plasma system including a showerhead module 211 working in conjunction with a pedestal module 223, wherein the pedestal module 223 is heated. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the pedestal module 223. The power and frequency supplied by matching network 206 is sufficient to generate a plasma from the process gas/vapor. In an embodiment both the HF generator and the LF generator are used, and in an alternate embodiment, just the HF generator is used. In a typical process, the HF generator is operated generally at frequencies of about 2-100 MHz; in a preferred embodiment at 13.56 MHz or 27 MHz. The LF generator is operated generally at about 50 kHz to 2 MHz; in a preferred embodiment at about 350 to 600 kHz. The process parameters may be scaled based on the chamber volume, substrate size, and other factors. Similarly, the flow rates of process gas, may depend on the free volume of the vacuum chamber or processing zone.

Within the chamber, the pedestal module 223 supports a substrate 13 on which materials such as thin films may be deposited. The pedestal module 223 can include a fork or lift pins to hold and transfer the substrate during and between the deposition and/or plasma treatment reactions. In an embodiment, the substrate 13 may be configured to rest on a surface of the pedestal module 223, however in alternate embodiments the pedestal module 223 may include an electrostatic chuck, a mechanical chuck, or a vacuum chuck for holding the substrate 13 on the surface of the pedestal module 223. The pedestal module 223 can be coupled with a heater block 220 for heating substrate 13 to a desired temperature. Generally, substrate 13 is maintained at a temperature of about 25° C. to 500° C. or greater depending on the material to be deposited.

In certain embodiments, a system controller 228 is employed to control process conditions during deposition, post deposition treatments, and/or other process operations. The controller 228 will typically include one or more memory devices and one or more processors. The processor may include a CPU or computer, analog and/or digital input/output connections, stepper motor controller boards, etc.

In certain embodiments, the controller 228 controls all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, and other parameters of a particular process. Other computer programs stored on memory devices associated with the controller may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the chamber.

Figure 3:
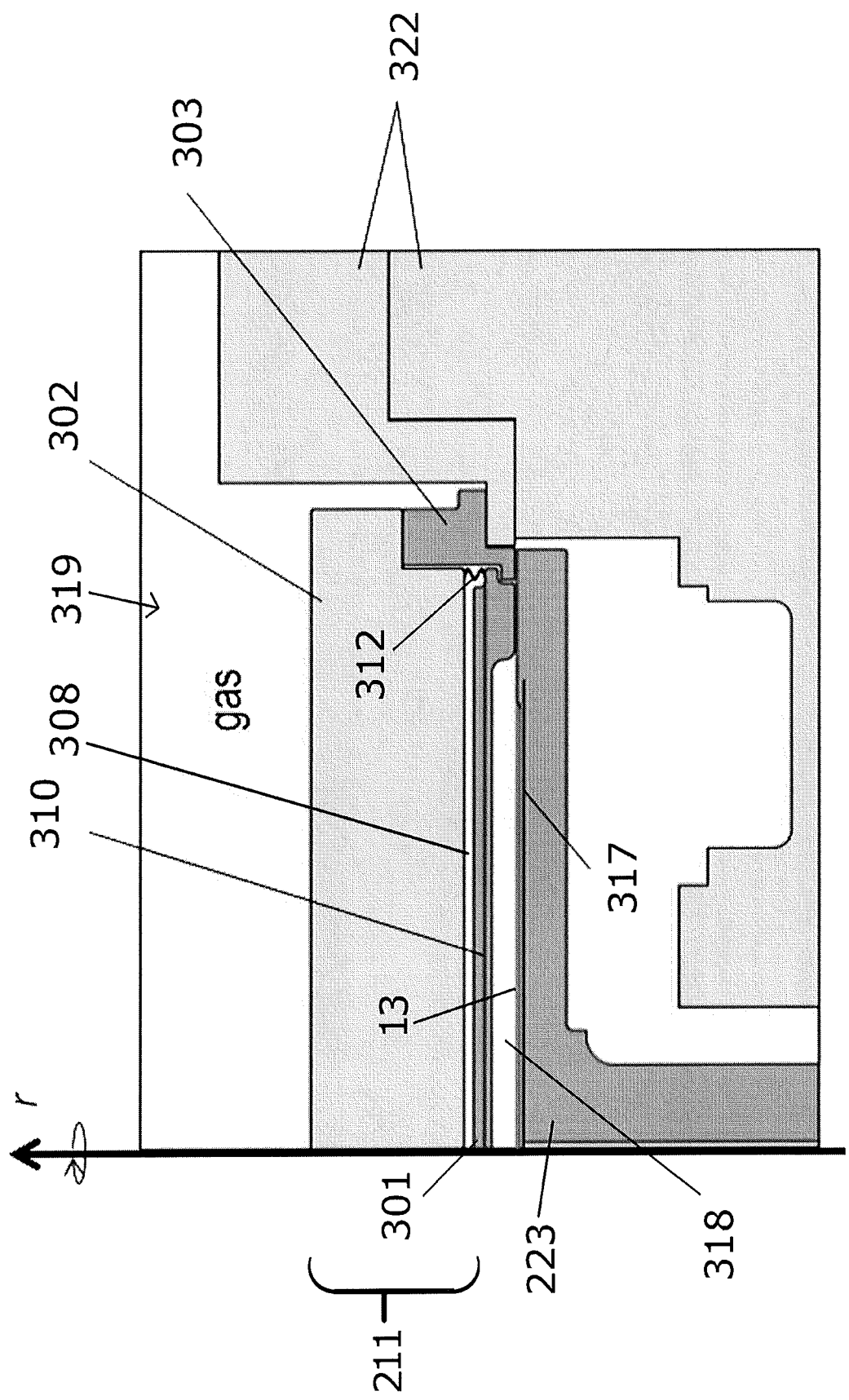
FIG. 3 illustrates a cross section of the pedestal module and the showerhead module arranged in accordance with embodiments disclosed herein.

FIG. 3 illustrates a cross section of a chemical isolation chamber 319 including the pedestal module 223 and the showerhead module 211 of FIGS. 1 and 2 in greater detail wherein the pedestal module 223 and showerhead module 211 form a cavity 318 in which a semiconductor substrate is processed. The cavity 318 is formed between the showerhead module 211 and the pedestal module 223 wherein a lower surface of a faceplate 301 of the showerhead module 211 forms an upper wall and a sidewall of the cavity 318, and an upper surface of the pedestal module 223 forms a lower wall of the cavity 318. An exemplary embodiment of a deposition apparatus which includes dual chamber seals can be found in commonly assigned U.S. Pat. No. 7,737,035 which is hereby incorporated by reference in its entirety.

The pedestal module 223 includes a bottom RF electrode 317 and the substrate 13 sits on the pedestal module 223. Preferably the bottom RF electrode 317 is grounded. The distance between the top of the substrate 13 and the bottom surface of the showerhead module 211 during processing is preferably about 5 to 16 millimeters. The pedestal module 223 includes a heater (see FIG. 2) and the faceplate 211 of the showerhead module 211 is heated from heat released from the pedestal module 223 during processing and by plasma struck in the cavity 318 during processing. In some embodiments, the temperature inside the chamber may be maintained through a heating mechanism in the showerhead module 211 and the pedestal module 223. Preferably, the substrate 13 is located in an isothermal environment. An isothermal processing zone is formed by maintaining each exposed surface of the cavity 318 at a desired temperature. The isothermal processing zone allows the substrate 13 to be uniformly heated and maintained at a desired temperature so that an undesired temperature gradient is not formed across the substrate 13. To form the isothermal processing zone, heat loss from the faceplate 301 to a backing plate 302 and heat loss from the faceplate 301 to an isolation ring 303 is minimized. In an embodiment, the showerhead module 211 can be heated to greater than about 250° C., and/or the pedestal module 223 can be heated to greater than about 250° C. to 500° C. or greater than about 500° C. In a preferred embodiment, each exposed surface of the cavity 318 is formed from a ceramic material.

The showerhead module 211 includes the faceplate 301, the backing plate 302, and the isolation ring 303, wherein the isolation ring surrounds the faceplate 301 and the backing plate 302 and supports the backing plate 302. The isolation ring 303 is preferably formed from a ceramic material such as aluminum oxide ($Al_2O_3$) or aluminum nitride (AlN) and can be supported on a grounded chamber wall 322 of the chemical isolation chamber 319.

The backing plate 302 is formed from a metal material. For example the backing plate 302 can be formed from an aluminum alloy such as Al 6061 or stainless steel wherein the backing plate 302 can include a ceramic outer coating such as an aluminum oxide outer coating, a yttrium oxide outer coating, or a polymeric coating depending on the intended application. In a preferred embodiment, the backing plate 302 is RF hot, i.e., powered by an RF source. In an embodiment, the backing plate 302 can be a cooled backing plate. The faceplate 301 is preferably formed from a ceramic or metal material and in preferred embodiments can be formed from aluminum oxide ($Al_2O_3$), or aluminum nitride (AlN). The faceplate 301 can be electrically conductive or made of ceramic material with an RF electrode 310 embedded therein wherein the embedded RF electrode 310 is preferably a mesh electrode. A gas plenum 308 is formed between the faceplate 301 and the backing plate 302. Preferably the height of the gas plenum 308 between the faceplate 301 and the backing plate 302 enables good gas flow from the plenum 308 to the cavity 318 while providing minimal plenum 308 volume. Preferably the height of the plenum 308 is about 2 to 6 mm. At least one RF contact 312 electrically connects the backing plate 302 and the RF electrode 310 embedded in the faceplate 301. In an embodiment, the RF contact 312 can be an annular RF contact made of a metallic strip having at least one bend wherein the RF contact 312 forms an outer perimeter of the gas plenum 308 between the faceplate 301 and the backing plate 302. Preferably the RF contact 312 forms a thermal choke between the faceplate 301 and the backing plate 302.

FIG. 4A illustrates an exemplary embodiment of a showerhead module 211 and substrate support 223 which form an isothermal processing zone wherein a support element attaches a faceplate of the showerhead module to the backing plate of the showerhead module. Preferably each surface which is exposed to the isothermal processing zone is a ceramic surface which is maintained at a desired temperature. The showerhead module 211 includes a faceplate 301 wherein a lower surface of the faceplate forms an upper wall of a cavity 318 and optionally a sidewall of the cavity 318 defining the isothermal processing zone, a backing plate 302, and an isolation ring 303, wherein the isolation ring 303 surrounds the faceplate 301 and the backing plate 302. The backing plate 302 can include one or more gas inlets 305 and one or more gas outlets 315 (see FIG. 4E), and the faceplate 301 preferably includes a plurality of through holes 304 for delivering process gas to the isothermal processing zone, delivering inert gas to the isothermal processing zone, or removing process and/or inert gas from the isothermal processing zone.

For example, the central zone of the faceplate which extends completely over the wafer can include concentric gas inlets and gas outlets to deliver process gas and withdraw reacted gas from the isothermal processing zone. A suitable arrangement of concentric inlets and outlets is disclosed in U.S. Pat. No. 5,102,523 or 5,614,026, incorporated herein by reference.

At least one compression seal can be located between the backing plate and the faceplate wherein each compression seal can form a boundary of at least one gas plenum. For example, two compression seals can be used to form gas plenums wherein the first compression seal is a first annular lever seal 306a which is compressed between the faceplate 301 and the backing plate 302 and wherein the first annular lever seal 306a forms an inner gas plenum 308a. The inner gas plenum 308a can be in fluid communication with the one or more gas inlets 305 of the backing plate 302 and a plurality of the through holes 304 of the faceplate 301 such that a process gas can be delivered therethrough into the cavity 318 which defines the isothermal processing zone. The second compression seal can be a second annular lever seal 306b which surrounds the first annular lever seal 306a and is compressed between the faceplate 301 and the backing plate 302 wherein the second annular lever seal 306a forms an intermediate plenum 308b which surrounds the inner gas plenum 308a. The intermediate plenum 308b can be in fluid communication with the one or more gas outlets 315 of the backing plate 302 and a plurality of the through holes 304 of the faceplate 301 such that a process gas can be removed from the isothermal processing zone in cavity 318 by the vacuum source. In an embodiment, an outer gas plenum 308c surrounds the intermediate plenum 308b. Preferably the outer gas plenum 308c can deliver inert gas to a gap between the faceplate 301 and the isolation ring 303 which is in fluid communication with the isothermal processing zone in cavity 318 and wherein the isolation ring 303 forms an outer periphery of the outer gas plenum 308c. Preferably each annular lever seal 306a,b provides a spring force opposing the faceplate 301 and the backing plate 302 wherein each lever seal 306a,b has at least one bend with a length between a lower free end in contact with the faceplate 301 and an upper free end in contact with the backing plate 302 of about 0.5 to 1.5 inch, and a thickness of about 0.003 to 0.009 inch. Preferably each lever seal 306a,b has an S-shaped, C-shaped, E-shaped, Z-shaped, or V-shaped cross section.

In an embodiment, the faceplate 301 is attached to the backing plate 302 with a support element comprising a plurality of cam lock assemblies 309. When coupled, each cam lock assembly 309 is configured to compress each annular lever seal 306a,b between the faceplate 301 and the backing plate 302. Each compressed annular lever seal 306a,b forms a thermal choke between the faceplate 301 and the backing plate 302 such that heat loss from the faceplate 301 to the backing plate 302 may be minimized while forming gas plenums 308a,b,c between the faceplate 301 and the backing plate 302.

Each cam lock assembly 309 preferably includes a stud (locking pin) 505 mounted into a socket 513. The socket 513 can be mounted in a socket hole 513a in the faceplate. In an embodiment, the socket 513 can include external threads wherein the socket 513 is mounted into the socket hole 513a which has corresponding internal threads. Alternatively the socket 513 may be bonded into the socket hole 513a. The cam lock assembly 309 is capable of quickly, cleanly, and accurately attaching the faceplate 301 to the backing plate 302. The stud 505 can be formed of a metal or metal alloy including for example stainless steel (such as Nitronic-60) or molybdenum, and may be surrounded by a disc spring stack 515, such as, for example, stainless steel Belleville washers, or washers formed from alloy such as Haynes 242®. The stud 505 and the disc spring stack 515 are arranged into the socket 513 such that a limited amount of lateral movement is possible between the faceplate 301 and the backing plate 302 to account for differences in thermal expansion between the two parts.

Other portions of each cam lock assembly 309 can include a camshaft bearing assembly 507 which is mounted in a backing plate bore 511 of the backing plate 302 which is configured to receive the stud 505. An exemplary embodiment of a cam lock assembly which can be used to couple a faceplate of a showerhead module to a backing plate of the showerhead module can be found in commonly assigned U.S. Pat. No. 8,272,346, which is incorporated by reference herein in its entirety.

Figure 4C:
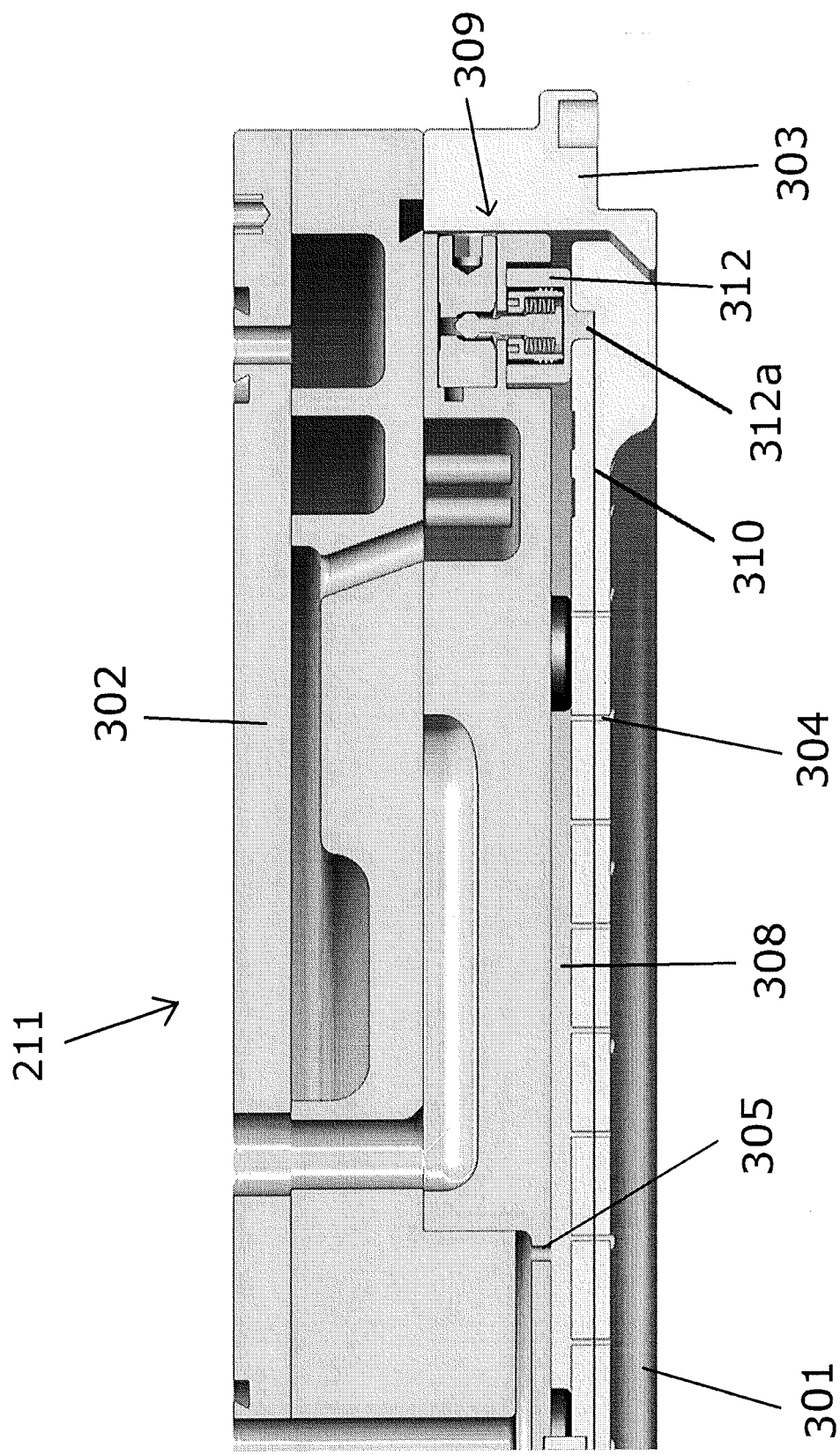

Each cam lock assembly 309 can include an electrically conductive socket which forms an RF contact 312, wherein the RF contact 312 electrically connects the RF electrode 310 of the faceplate 301 with the backing plate 302 which is RF hot. Each RF contact 312 can be formed of metal or any suitable conducting material, however in a preferred embodiment, each RF contact 312 is formed from tungsten. Alternatively, each RF contact 312 can be formed from stainless steel or an austenitic nickel-chromium base alloy. Further, each RF contact 312 can include a nickel outer coating. Each cam lock assembly 309 preferably provides a minimum contact area between the faceplate 301 and the backing plate 302 such that the faceplate 301 can be thermally isolated from the remainder of the showerhead module 211. Thermally isolating the faceplate 301 of the showerhead module 211 reduces heat loss from an upper surface thereof to the backing plate 302 as well as heat loss at an outer periphery thereof to the isolation ring 303 which surrounds the faceplate 301, thereby forming an isothermal processing zone in cavity 318. Thermally isolating the faceplate 301 allows a desired temperature to be maintained across the lower surface of the faceplate 301 and leads to more uniform substrate processing. The contact area between the support element (cam locks) and the faceplate is less than 1% of the total surface area of the faceplate. Preferably the total contact area is less than 0.5% of the total surface area of the faceplate, less than 0.3% of the total surface area of the faceplate, less than 0.2% of the total surface area of the faceplate, less than 0.1% of the total surface area of the faceplate; or less than 0.05% of the total surface area of the faceplate. As illustrated in FIG. 4C, the RF contact 312 may form the socket of the cam lock assembly 309, wherein a lower portion 312a of the RF contact 312 can be mounted in the faceplate 301 so as to minimize the contact area between the faceplate 301 and the backing plate 302 and provide reduced thermal transfer therebetween. The lower portion 312a of the RF contact 312 is preferably brazed to the embedded RF electrode 310.

FIG. 4B illustrates an embodiment of a showerhead module 211 and substrate support 223 which are configured to form an isothermal processing zone in the cavity 318 which has an improved RF profile. As illustrated in FIG. 4B, the bottom RF electrode 317 of the pedestal module 223 can be lengthened such that is extends to the outer periphery, or beyond the outer periphery of the cavity 318. Extending the bottom RF electrode 317, which is preferably a grounded electrode, beyond the periphery of the cavity 318 reduces the strength of the electric field between the pedestal module 223 and a surrounding grounded chamber wall 322 such that the potential for arcing therebetween is also reduced. Preferably, the bottom RF electrode 317 has a diameter greater than about 12.5 inches and more preferably the bottom RF electrode 317 has a diameter greater than about 15 inches such as a diameter of about 15.6 inches.

Figure 4D:
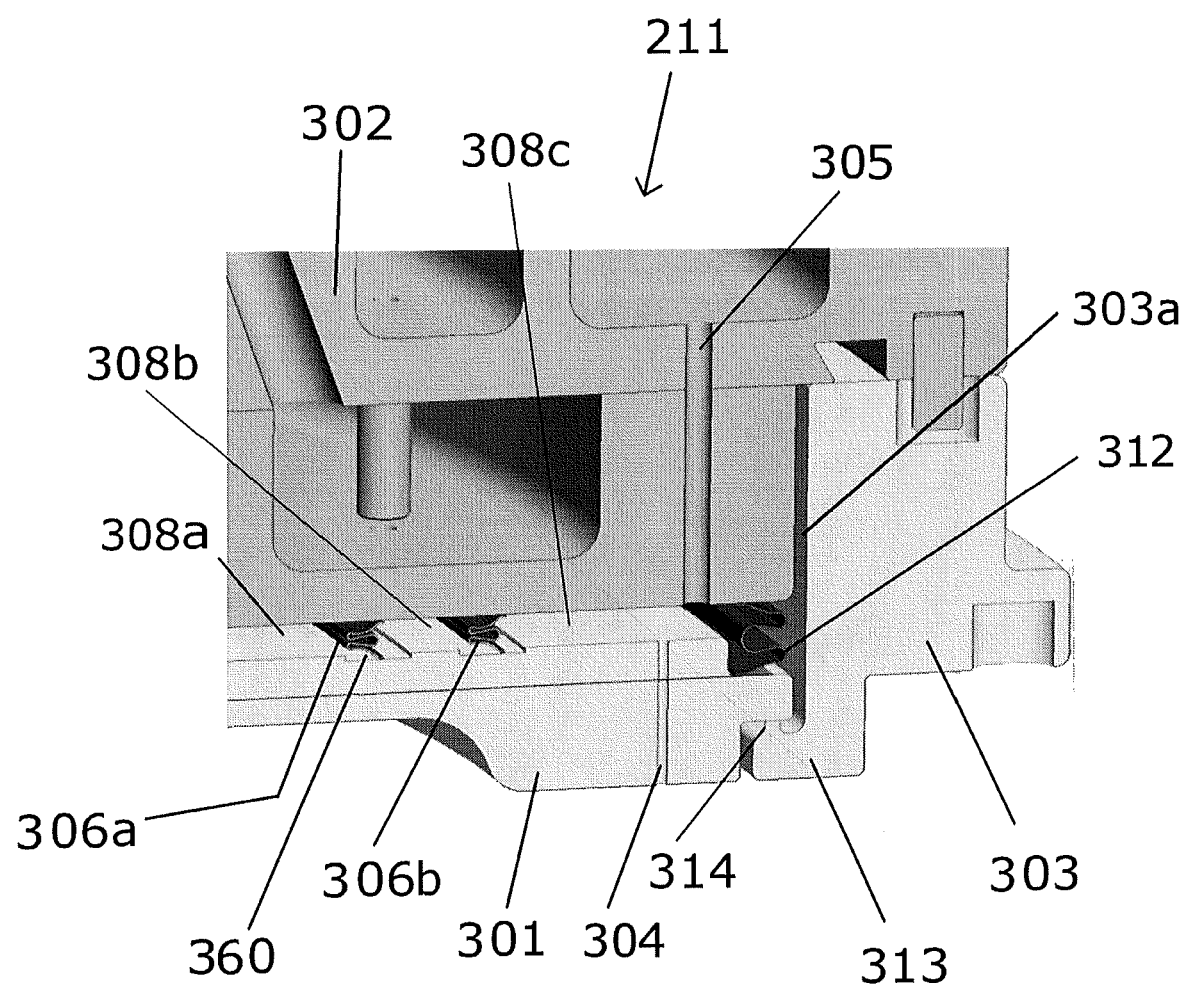

In an embodiment, as illustrated in FIG. 4D, the isolation ring 303 includes a support element which attaches the faceplate 301 to the backing plate 302, and compresses each annular lever seal 306a,b therebetween wherein the isolation ring 303 includes an inner annular flange 313 which underlies an outer portion of the faceplate 301 and the inner annular flange 313 has at least one upwardly extending projection 314 located thereon which supports the faceplate 301. The at least one upwardly extending projection 314 contacts the faceplate 301 and provides a thermal choke which biases the faceplate 301 against the backing plate 302 (i.e. maintains the faceplate 301 parallel with respect to the backing plate 302). Preferably at least three upwardly extending projections 314 support the faceplate 301. The at least one upwardly extending projection 314 minimizes the contact area between the isolation ring 303 and the faceplate 301, such that the faceplate 301 may be thermally isolated from the isolation ring 303 at an outer periphery thereof as well the remainder of the showerhead module 211. Thermally isolating the faceplate 301 from the remainder of the showerhead module 211 can provide an isothermal processing zone in cavity 318 which leads to more uniform substrate processing. The maximum total contact area between the at least one upwardly extending projection 314 of the isolation ring 303 and the faceplate 301 is less than about 0.05 in$^2$, and preferably less than about 0.02 in$^2$, and more preferably less than about 0.01 in$^2$. When attached, the isolation ring 303 is configured to compress the first annular lever seal 306a between the faceplate 301 and the backing plate 302 so as to form the inner gas plenum 308a, and to compress the second annular lever seal 306b so as to form the intermediate gas plenum 308b. In an embodiment, an upper surface of the faceplate 301 can include annular recesses 360 wherein a lower portion of each annular lever seal 306a,b is supported in a respective annular recess 360. In a further embodiment, a lower surface of the backing plate 302 can also include annular recesses 360 wherein an upper portion of each annular lever seal 306a,b is supported in a respective annular recess 360. An RF contact 312 electrically connects the RF electrode 310 embedded in the faceplate 301 with the backing plate 302 which is RF hot. The RF contact 312 can be formed of any suitable conducting material such as, stainless steel, tungsten, an austenitic nickel-chromium based alloy preferably including an outer nickel plating such as nickel plated Inconel®, and the like. In a preferred embodiment, the RF contact 312 is an annular RF contact made of a metallic strip having at least one bend wherein the RF contact is electrically connected to an RF electrode embedded in the ceramic faceplate and wherein the annular RF contact surrounds the second annular lever seal 306b and forms the outer perimeter of an outer gas plenum 308c between the backing plate 302 and the faceplate 301. A gas inlet 305 in the backing plate 302 can be configured to deliver an inert gas to the outer gas plenum 308c wherein the inert gas can then be delivered to an outer periphery of the cavity 318 via through holes 304 in the faceplate 301 which are in fluid communication with the outer gas plenum 308c. The RF contact 312 has at least one bend compressible therein wherein the diameter of the bend is configured to minimize the potential for arcing between an inner surface 303a of the isolation ring 303 and an outer surface of the RF contact 312.

Figure 4E:
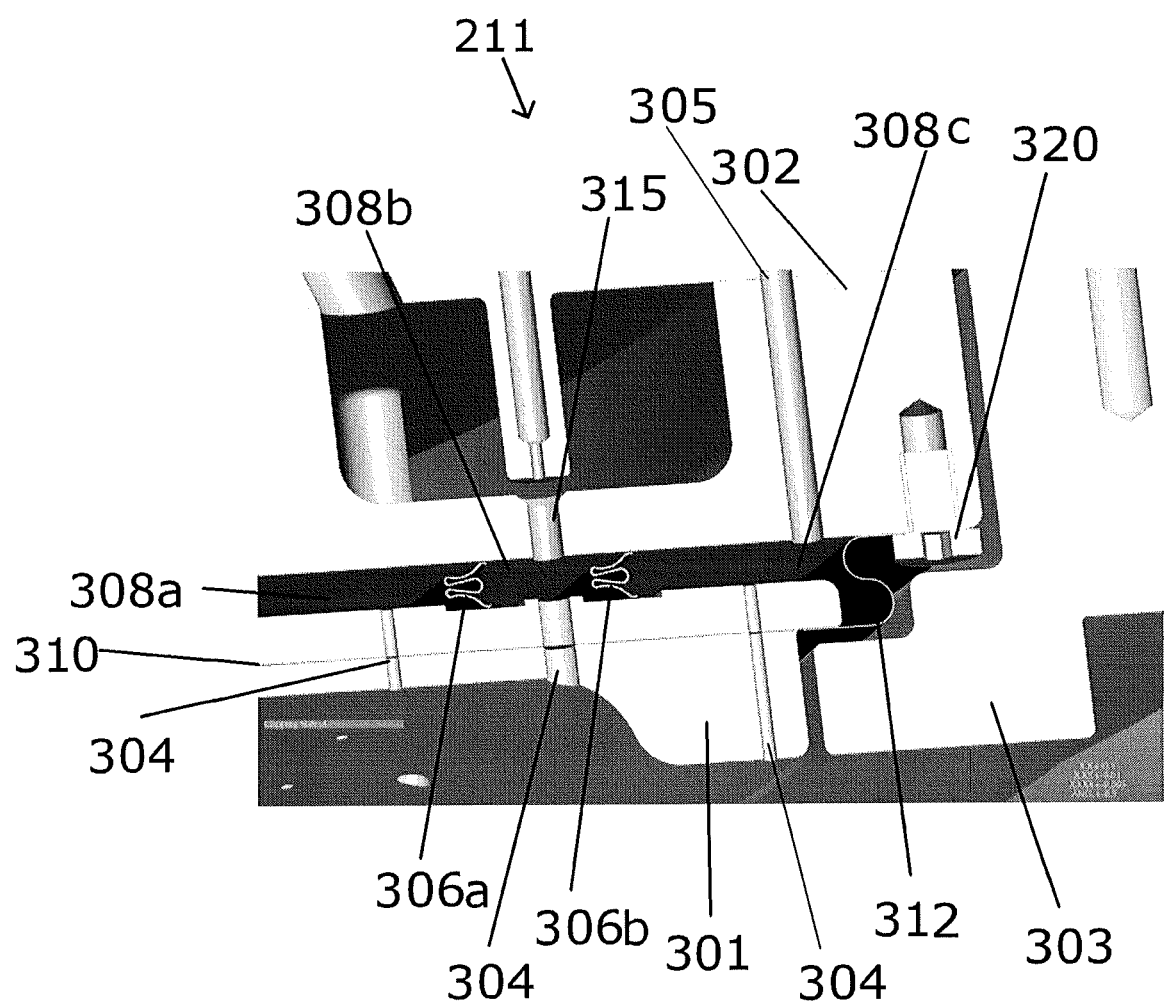

In an embodiment, as illustrated in FIG. 4E, the support element comprises an RF contact 312 which attaches the faceplate 301 to the backing plate 302 as well as electrically connect the faceplate 301 to the backing plate 302. The RF contact 312 is preferably an annular RF contact made of a metallic strip having at least one bend wherein the RF contact 312 provides a clamping force between the faceplate 301 and the backing plate 302 to compress lever seals 306a,b. The at least one bend preferably has a diameter configured to minimize a potential for arcing between an inner surface 303a of the isolation ring 303 and an outer surface of the RF contact 312. The annular RF contact 312 forms the outer perimeter of the outer gas plenum 308c between the backing plate 302 and the faceplate 301. A lower end of the RF contact 312 is preferably brazed to an exposed portion of the RF electrode 310 embedded in the faceplate 301, while an upper end of the RF contact 312 is preferably attached to the backing plate 302 with suitable mechanical fasteners 320, which can be threaded bolts, screws, or the like. In a preferred embodiment, about 9 to 12 mechanical fasteners 320 may attach the upper end of the RF contact 312 to the backing plate 302, however in an alternate embodiment more fasteners 320 may be utilized. The RF contact 312 preferably has a length between a lower free end in contact with the faceplate and an upper free end in contact with the backing plate of about 0.5 to 1.5 inch, and a thickness of about 0.003 to 0.009 inch. Preferably the RF contact has an S-shaped, C-shaped, E-shaped, Z-shaped, or V-shaped cross section. When attached, the RF contact 312 compresses each annular lever seal 306a,b between the faceplate 301 and the backing plate 302 wherein the RF contact 312 surrounds the second annular lever seal 306b and forms the plenum 308c. The RF contact 312 electrically connects the RF electrode 310 of the faceplate 301 with the backing plate 302 which is RF hot. The RF contact 312 can be formed of any suitable conducting material such as, stainless steel, tungsten, an austenitic nickel-chromium based alloy and the RF contact 312 preferably includes an outer nickel plating such as nickel plated Inconel®, and the like.

The faceplate 301 preferably includes at least one upwardly extending spacer 307 (See FIG. 5A) on an upper surface 301a at an outer periphery thereof, wherein the at least one upwardly extending spacer 307 maintains a desired plenum height between the faceplate 301 and the backing plate 302 and wherein the at least one spacer 307 is configured to maintain the faceplate 301 parallel with respect to the backing plate 302. In a preferred embodiment, at least three upwardly extending spacers 307 are located between the faceplate 301 and the backing plate 302. In an alternate embodiment, the at least one spacer 307 can be provided on the lower surface 302a of the backing plate 302 in a downwardly extending fashion. For example, the spacer 307 can be a sapphire ball which is pressed into the lower surface 302a of the backing plate 302. The total contact area between the at least one upwardly extending spacer 307 of the faceplate 301 and the backing plate 302 is less than about 0.5 in$^2$, preferably less than about 0.05 in$^2$, and more preferably less than about 0.01 in$^2$.

FIG. 5B illustrates an embodiment of the showerhead module 211, wherein at least one spacer 307 is located between the faceplate 301 and the backing plate 302 wherein the spacer 307 maintains a desired gas plenum height therebetween wherein the at least one spacer 307 is configured to maintain the faceplate 301 parallel with respect to the backing plate 302. Preferably at least three spacers 307 are located between the faceplate 301 and the backing plate 302. The spacers 307 can be integral to the faceplate 301 (See FIG. 5A) or alternatively the spacers 307 can be spheres located in an outer periphery of the gas plenum 308, wherein the spacers 307 are freely movable such that they may allow for thermal expansion and contraction of the faceplate 301 and the backing plate 302 such that a desired plenum height therebetween may be maintained. Preferably the spacers 307 are formed from a ceramic material. In an alternative preferred embodiment, the spacers 307 can be formed from quartz or sapphire.

FIG. 6 illustrates an embodiment of the showerhead module 211 wherein the RF contact 312 forms a friction contact with a metalized surface 401 of the faceplate 301 which is in electrical contact with the RF electrode 310 embedded in the faceplate 301, wherein the RF contact 312 electrically connects the RF electrode 310 of the faceplate 301 with the backing plate 302 which is RF hot. The lower surface of the faceplate 301 forms an upper wall of the cavity 318 wherein the lower surface of the faceplate 301 includes a ring 402 of like material around an outer periphery thereof wherein an inner surface of the ring 402 forms a sidewall of the cavity 318 defining the isothermal processing zone in cavity 318. Preferably the ring 402 is bonded or mechanically attached with suitable fasteners, such as screws 403, to the lower surface of the faceplate 301.

While the plasma processing apparatus including an isothermal processing zone has been described in detail with reference to specific embodiments thereof, it will be apparent to those skilled in the art that various changes and modifications can be made, and equivalents employed, without departing from the scope of the appended claims.

What is claimed is:

1. A deposition apparatus for processing semiconductor substrates having an isothermal processing zone, comprising:
    a chemical isolation chamber in which semiconductor substrates are processed;
    a process gas source in fluid communication with the chemical isolation chamber for supplying a process gas into the chemical isolation chamber;
    a showerhead module which delivers process gases from the process gas source to the isothermal processing zone wherein the showerhead module includes a faceplate wherein a lower surface of the faceplate forms an upper wall of a cavity defining the isothermal processing zone; a backing plate; an isolation ring which surrounds the faceplate and the backing plate wherein the isolation ring supports the backing plate; a support element which attaches the faceplate to the backing plate; and at least one compression seal which forms an outer perimeter of a central plenum between the faceplate and the backing plate wherein a contact area between the support element and the faceplate is less than 1% of the total surface area of the faceplate, the compression seal comprising an annular lever seal which is compressed between the faceplate and the backing plate;
    a substrate pedestal module configured to heat and support a semiconductor substrate wherein an upper surface of the pedestal module forms a lower wall of the cavity defining the isothermal processing zone within the chemical isolation chamber,
    wherein the faceplate is a ceramic faceplate and the deposition apparatus further comprises an annular RF contact made of a metallic strip having at least one bend wherein the RF contact is electrically connected to an RF electrode embedded in the ceramic faceplate and wherein the annular RF contact forms the outer perimeter of an outer gas plenum between the backing plate and the ceramic faceplate;
    wherein the support element comprises at least one upwardly extending projection which contacts the ceramic faceplate, wherein the at least one upwardly extending projection is located on an inner annular flange of the isolation ring, wherein the inner annular flange of the isolation ring underlies an outer portion of the ceramic faceplate; and
    wherein the at least one compression seal comprises first and second compression seals wherein the first compression seal is a first annular lever seal which is compressed between the faceplate and the backing plate and forms an inner gas plenum between the faceplate and the backing plate and the second compression seal is a second annular lever seal which is compressed between the faceplate and the backing plate wherein the second lever seal surrounds the first lever seal and forms an intermediate gas plenum which surrounds the inner gas plenum, and wherein an outer gas plenum surrounds the intermediate gas plenum.

2. The deposition apparatus of claim 1, wherein the deposition apparatus includes:
    (a) an RF energy source adapted to energize the process gas into a plasma state in the isothermal processing zone;
    (b) a control system configured to control processes performed by the deposition apparatus;
    (c) a non-transitory computer machine-readable medium comprising program instructions for control of the deposition apparatus; and/or
    (d) a vacuum source in fluid communication with the isothermal processing zone for evacuating process gas from the isothermal processing zone.

3. The deposition apparatus of claim 1, wherein the annular RF contact:
    (a) comprises tungsten, stainless steel, or an austenitic nickel-chromium based alloy;
    (b) comprises a metallic material and has a nickel outer coating;
    (c) is brazed to an RF electrode embedded in the faceplate;
    (d) has a length between a lower free end in contact with the faceplate and an upper free end in contact with the backing plate of about 0.5 to 1.5 inch, and a thickness of about 0.003 to 0.009 inch;
    (e) has an S-shaped, C-shaped, E-shaped, Z-shaped, or V-shaped cross section; and/or
    (f) forms a friction contact with a metalized surface of the faceplate wherein the metalized surface is in electrical contact with the RF electrode embedded in the faceplate.

4. The deposition apparatus of claim 1, wherein the compression seal:
    (a) comprises tungsten, stainless steel, or an austenitic nickel-chromium base alloy;
    (b) comprises a metallic material and has a nickel outer coating;
    (c) provides a spring force opposing the backing plate and the faceplate;
    (d) comprises a compressible ring of metallic strip material which has at least one bend in a cross section thereof wherein a length between a lower free end in contact with the faceplate and an upper free end in contact with the backing plate is about 0.5 to 1.5 inch, and a thickness of about 0.003 to 0.009 inch; and/or
    (e) comprises a compressible ring of metallic strip material which has an S-shaped, C-shaped, E-shaped, Z-shaped, or V-shaped cross section.

5. The deposition apparatus of claim 1, wherein the total contact area is less than
    (a) 0.5% of the total surface area of the faceplate;
    (b) 0.3% of the total surface area of the faceplate;
    (c) 0.2% of the total surface area of the faceplate;
    (d) 0.1% of the total surface area of the faceplate; or
    (e) 0.05% of the total surface area of the faceplate.

6. The deposition apparatus of claim 1, wherein the contact area between the faceplate and the at least one upwardly extending projection of the isolation ring has a maximum total contact area of:
    (a) less than about 0.05 in$^2$;
    (b) less than about 0.02 in$^2$; or
    (c) less than about 0.01 in$^2$.

7. The deposition apparatus of claim 1, wherein at least one spacer is included between the faceplate and the backing plate, wherein the at least one spacer is configured to maintain the faceplate parallel with respect to the backing plate.

8. The deposition apparatus of claim 1, wherein:
(a) the faceplate is formed from aluminum oxide or aluminum nitride and the embedded RF electrode is electrically connected to the RF contact;
(b) the substrate pedestal module includes a bottom RF electrode wherein an outer periphery of the bottom RF electrode extends outward of the outer periphery of the cavity;
(c) the inner plenum between the faceplate and the backing plate has a height of about 2 to 6 mm;
(d) the lower surface of the faceplate forms the upper wall and a sidewall of the cavity;
(e) the lower surface of the faceplate includes a ring at an outer periphery thereof wherein an inner surface of the ring forms the sidewall of the cavity;
(f) each exposed surface of the cavity is formed from a ceramic material;
(g) each of the annular lever seals is positioned in an annular recess in the faceplate; or
(h) each of the annular lever seals is positioned in an annular recess in the backing plate.

9. A method of processing a semiconductor substrate in the deposition apparatus according to claim 1, comprising:
supplying the process gas from the process gas source into the isothermal processing zone; and
processing a semiconductor substrate in the isothermal processing zone;
wherein the processing is at least one of chemical vapor deposition; plasma-enhanced chemical vapor deposition; atomic layer deposition; plasma-enhanced atomic layer deposition; pulsed deposition layer; and/or plasma enhanced pulsed deposition layer.

10. A showerhead module of a plasma processing apparatus configured to deliver process gases to an isothermal processing zone of the plasma processing apparatus comprising:
a faceplate wherein a lower surface of the faceplate forms an upper wall of a cavity defining the isothermal processing zone;
a backing plate;
an isolation ring which surrounds the faceplate and the backing plate wherein the isolation ring supports the backing plate;
a support element which attaches the faceplate to the backing plate;
at least one compression seal which forms an outer perimeter of a central gas plenum between the faceplate and the backing plate, the compression seal comprising an annular lever seal which is compressed between the faceplate and the backing plate,
wherein a contact area between the support element and the faceplate is less than 1% of the total surface area of the faceplate,
wherein the faceplate is a ceramic faceplate and the deposition apparatus further comprises an annular RF contact made of a metallic strip having at least one bend wherein the RF contact is electrically connected to an RF electrode embedded in the ceramic faceplate and wherein the annular RF contact forms the outer perimeter of an outer gas plenum between the backing plate and the ceramic faceplate;
wherein the support element comprises at least one upwardly extending projection which contacts the faceplate, wherein the at least one upwardly extending projection is located on an inner annular flange of the isolation ring, wherein the inner annular flange of the isolation ring underlies an outer portion of the faceplate; and
wherein the at least one compression seal comprises first and second compression seals wherein the first compression seal is a first annular lever seal which is compressed between the faceplate and the backing plate and forms an inner gas plenum between the faceplate and the backing plate and the second compression seal is a second annular lever seal which is compressed between the faceplate and the backing plate wherein the second lever seal surrounds the first lever seal and forms an intermediate gas plenum which surrounds the inner gas plenum, and wherein an outer gas plenum surrounds the intermediate gas plenum.

11. The showerhead module of claim 10, wherein the annular RF contact:
(a) comprises tungsten, stainless steel, or an austenitic nickel-chromium based alloy;
(b) comprises a metallic material and has a nickel outer coating;
(c) is brazed to the RF electrode embedded in the faceplate;
(d) has a length between a lower free end in contact with the faceplate and an upper free end in contact with the backing plate of about 0.5 to 1.5 inch, and a thickness of about 0.003 to 0.009 inch;
(e) has an S-shaped, C-shaped, E-shaped, Z-shaped, or V-shaped cross section; and/or
(f) forms a friction contact with a metalized surface of the faceplate wherein the metalized surface is in electrical contact with the RF electrode embedded in the faceplate.

12. The showerhead module of claim 10, wherein at least one spacer is included between the faceplate and the backing plate, wherein the spacer is configured to maintain the faceplate parallel with respect to the backing plate.

13. The showerhead module of claim 10, wherein the compression seal:
(a) comprises tungsten, stainless steel, or an austenitic nickel-chromium base alloy;
(b) comprises a metallic material and has a nickel outer coating;
(c) provides a spring force opposing the backing plate and the faceplate;
(d) comprises a compressible ring of metallic strip material which has at least one bend in a cross section thereof wherein a length between a lower free end in contact with the faceplate and an upper free end in contact with the backing plate is about 0.5 to 1.5 inch, and a thickness of about 0.003 to 0.009 inch; and/or
(e) comprises a compressible ring of metallic strip material which has an S-shaped, C-shaped, E-shaped, Z-shaped, or V-shaped cross section.

14. The showerhead module of claim 10, wherein the contact area is less than
(a) 0.5% of the total surface area of the faceplate;
(b) 0.3% of the total surface area of the faceplate;
(c) 0.2% of the total surface area of the faceplate;
(d) 0.1% of the total surface area of the faceplate; or
(e) 0.05% of the total surface area of the faceplate.

15. The showerhead module of claim 10, wherein the contact area between the faceplate and the at least one upwardly extending projection of the isolation ring has a maximum total contact area of:
(a) less than about 0.05 in$^2$;
(b) less than about 0.02 in$^2$; or
(c) less than about 0.01 in$^2$.

16. The showerhead module of claim 10, wherein:
(a) the faceplate is formed from aluminum oxide or aluminum nitride and the embedded RF electrode is electrically connected to an RF contact;
(b) the plenum between the faceplate and the backing plate has a height of about 2 to 6 mm;
(c) the lower surface of the faceplate forms the upper wall and a sidewall of the cavity;
(d) the lower surface of the faceplate includes a ring at an outer periphery thereof wherein an inner surface of the ring forms the sidewall of the cavity;
(e) each exposed surface of the cavity is formed from a ceramic material;
(f) each of the annular lever seals is positioned in an annular recess in the faceplate; and/or
(g) each of the annular lever seals is positioned in an annular recess in the backing plate.

* * * * *